United States Patent [19]

Christie et al.

[11] 4,456,712

[45] Jun. 26, 1984

[54] BISMALEIMIDE TRIAZINE COMPOSITION

[75] Inventors: Frederick R. Christie, Endwell; Lawrence R. Daley, Binghamton, both of N.Y.

[73] Assignee: International Business Machines Corporation, Armonk, N.Y.

[21] Appl. No.: 488,830

[22] Filed: Apr. 26, 1983

Related U.S. Application Data

[63] Continuation-in-part of Ser. No. 388,316, Jun. 14, 1982, abandoned.

[51] Int. Cl.$^3$ .............................................. C08L 63/00
[52] U.S. Cl. .................................. 523/439; 428/290; 428/901; 523/400; 523/454
[58] Field of Search ...................... 523/439, 400, 454; 524/361; 428/290, 901

[56] References Cited

U.S. PATENT DOCUMENTS

| | | | |
|---|---|---|---|
| 3,058,946 | 10/1962 | Nemetz | 525/527 |
| 3,553,292 | 1/1971 | Stahly et al. | 525/26 |
| 3,936,414 | 2/1976 | Wright et al. | 523/517 |
| 4,129,616 | 12/1978 | Zingheim | 524/758 |
| 4,294,743 | 10/1981 | Graham | 523/454 |
| 4,294,877 | 10/1981 | Graham | 428/209 |
| 5,555,116 | 1/1971 | Stahly et al. | 525/26 |

OTHER PUBLICATIONS

Araldite LT 8049, A New Solid, Brominated, Flame-Retardant Epoxy Resin, Ciba-Geigy, Resins Department, Development Product Information.
Technical Bulletin BT Resin (Bismaleimide Triazine Resin) BT 2120A, Mitsubishi Gas Chemical Company, Inc.
Technical Bulletin BT Resin (Bismaleimide-Triazine Resin) Curing Catalyst, Mitsubishi Gas Chemical Company, Inc.
Araldite 8047, A High-Temperature Flame-Retardant Resin for Laminating, Ciba-Geigy, Resins Department, Product Data.
Chemical Economy & Engineering Review, Mar. 1978, vol. 10, No. 3, (No. 115), Triazine Chemistry and it's Application Development-Triazine and BT Resins as High Performance Materials, Satoshi Ayano.
Technical Bulletin BT Resin (Bismaleimide Triazine Resin) BT 2420, Mitsubishi Gas Chemical Company, Inc.
High Heat Resistant Resin BT Resin (Bismaleimide–Triazine), Mitsubishi Gas Chemical Company, Inc.
High Heat Resistant Resin BT Resin (Bismaleimide–Triazine) (The Second Edition), Mitsubishi Gas Chemical Company, Inc.
High Heat Resistant Polyimide Resin BT Resin (Bismaleimide-Triazine) (The Third Edition), Mitsubishi Gas Chemical Company, Inc.

*Primary Examiner*—Ronald W. Griffin
*Attorney, Agent, or Firm*—Pollock, Vande Sande & Priddy

[57] ABSTRACT

A composition suitable for making circuit boards containing a bismaleimide triazine polymeric component, a brominated epoxy polymeric component, and a solvent is provided.

14 Claims, No Drawings

BISMALEIMIDE TRIAZINE COMPOSITION

CROSS-REFERENCE TO RELATED APPLICATIONS

The present application is a continuation-in-part of copending U.S. application Ser. No. 388,316 filed June 14, 1982 and entitled "Bismaleimide Triazine Composition", now abandoned.

DESCRIPTION OF INVENTION

TECHNICAL FIELD

The present invention is concerned with a composition containing a bismaleimide triazine polymeric material. The compositions of the present invention are especially suitable as the matrix material for printed circuit boards. In particular, the present invention is concerned with a solution containing a bismaleimide triazine polymeric material and solvent which exhibits extraordinary stability characteristics.

BACKGROUND ART

Circuit boards find a wide variety of uses in the electrical industry such as for radios, televisions, appliances, and various electrical apparatus. A widely employed technique for preparing circuit boards is to impregnate a woven fiberglass sheet with a resin composition and then laminate a copper sheet to one or both sides of the resin impregnated fiberglass sheet. Next, an electrical circuit is etched into the copper to form the circuit board and then electrical connections can be soldered to the board when it is used.

Various resins have been suggested for the purpose of impregnating the fiberglass to prepare the circuit boards. For instance, polyimide resins have been used for such purpose. The use of the polyimide resins provides good quality circuit boards which possess high resistance to elevated temperatures, low thermal expansion, and good electrical properties including high electrical resistivity. However, circuit boards prepared from polyimide resins are relatively expensive when compared to circuit boards prepared from epoxy resin impregnated fiberglass sheets. Circuit boards of epoxy resin impregnated fiberglass sheets, although much less expensive than those prepared using polyimide resins, are not especially resistant to high temperatures, have reduced electrical properties and higher thermal expansion when compared to circuit boards of polyimide resin impregnated fiberglass sheets. In addition, other types of resin systems have been suggested for this purpose. For instance, a combination of certain epoxy resins and certain specific bismaleimide materials are suggested in U.S. Pat. Nos. 4,294,877 and 4,294,743.

Moreover, bismaleimide triazine polymeric materials have been suggested as a possible binder or matrix material for printed circuit boards. However, such materials do not form a stable solution in various low boiling point solvents. It is desirable to use low boiling solvents to assist in the rapid application of the resin when attempting to employ such for the purposes of preparing printed circuit boards. One suggestion to prevent such resins from coming out of the solution is to include a solvent such as dimethyl formamide or N-methyl pyrrolidone. Along these lines, see page 11 of High Heat Resistant Polyimide Resin BT Resin Bismaleimide Triazine (the third edition), Mitsubishi Gas Chemical Company, Inc.

Resin composition, when cured, should desirably exhibit a relatively high glass transition temperature and possess high resistance to elevated temperatures. Accordingly, compositions to be suitable as the matrix material for integrated circuit boards must possess a number of diverse characteristics including relatively high glass transition temperature when cured, solubility and stability in low boiling point solvents, adhesion to the fiberglass sheets, low thermal expansion, and high electrical resistivity.

SUMMARY OF INVENTION

The present invention provides a composition which exhibits extraordinary stability characteristics in low boiling point solvents. In addition, the compositions of the present invention have very high resistance to elevated temperatures and have very low thermal expansion characteristics when cured.

The composition of the present invention comprises about 70 to about 80% by weight of a bismaleimide triazine polymeric component and about 20 to about 30% by weight of a brominated epoxy polymeric component. The above amounts are based upon the total amount of bismaleimide triazine and brominated epoxy polymeric materials present in the composition. The composition also includes a solvent in an amount of about 10 to about 70% by weight based upon the total weight of the bismaleimide triazine and epoxy polymeric materials and solvent present in the composition. The brominated epoxy polymeric component contains at least about 45% by weight of bromine and is a tetrabrominated diglycidyl ether of a phenol. The present invention is also concerned with a product comprising a fibrous substrate impregnated with the composition discussed above and a curing agent.

BEST AND VARIOUS MODES FOR CARRYING OUT THE INVENTION

The compositions of the present invention contain a bismaleimide triazine polymeric component as the major solid component of the composition. Bismaleimide triazine polymeric materials are commercially available such as under the trade designation BT resin from Mitsubishi Gas Chemical Company, Inc., Tokyo, Japan. Discussions of bismaleimide triazine polymeric materials can be found in the following:

High Heat Resistant Resin BT Resin (Bismaleimide Triazine), Mitsubishi Gas Chemical Company, Inc.

High Heat Resistant Resin BT Resin (Bismaleimide Triazine) (the second edition), Mitsubishi Gas Chemical Company, Inc.

High Heat Resistant Polyimide Resin BT Resin (Bismaleimide Triazine) (the third edition), Mitsubishi Gas Chemical Company, Inc.

Chemical Economy and Engineering Review, March 1978, volume 10, number 3 (no. 115), Triazine Chemistry and Its Application Development-Triazine and BT Resins as High Performance Materials-Ayano.

Technical Bulletin BT Resin (Bismaleimide Triazine Resin) BT 2420, Mitsubishi Gas Chemical Company, Inc.

Technical Bulletin BT Resin (Bismaleimide Triazine Resin) BT 2120A, Mitsubishi Gas Chemical Company, Inc.

The disclosures in the above-identified materials are incorporated herein by reference.

The bismaleimide triazine polymeric materials employed according to the present invention are thermosetting polyimide resins of additional polymerization type containing triazine and bismaleimide moieties. Bismaleimide triazine polymeric materials are from the polymerization of bisphenol A-dicyanate and the bisimide of 4,4' diaminodiphenyl methane and maleic anhydride. The following is a representative model of a bismaleimide triazine polymeric material reported by Mitsubishi Gas Chemical Company, Inc., the manufacturer of BT resins.

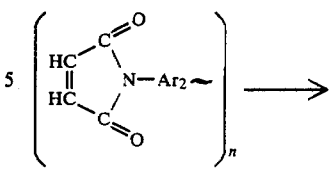

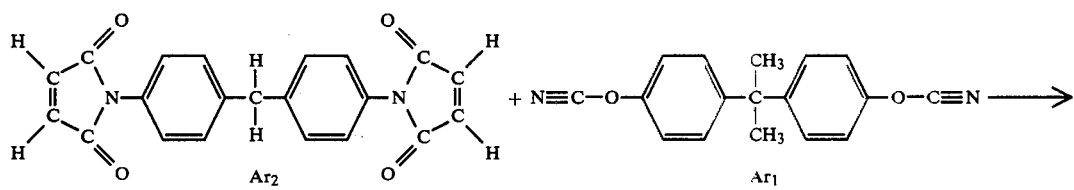

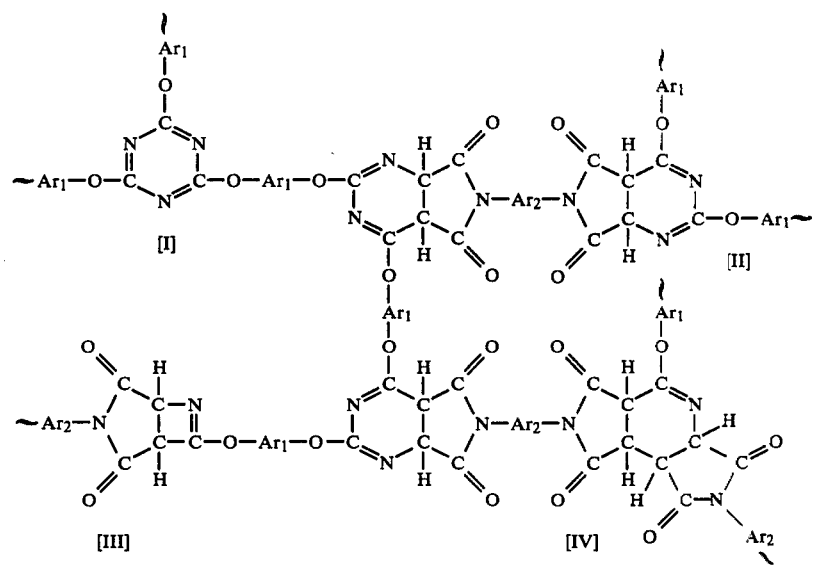

Any particular bismaleimide triazine polymeric component may include one or more of the segments I, II, III, and IV. Moreover, as reported on pages 4 and 5 of High Heat Resistant Resin BT Resin (Bismaleimide Triazine) (the third edition), Mitsubishi Gas Chemical Company, Inc., the bismaleimide triazine polymeric material can include as triazine moiety

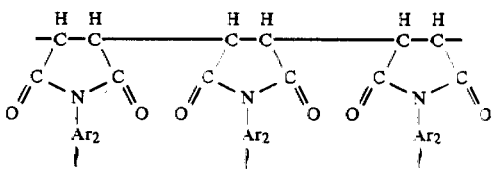

and/or as bismaleimide moiety

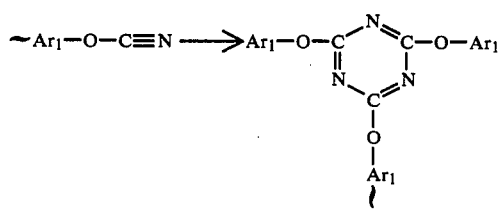

The preferred bismaleimide triazine polymeric materials employed according to the present invention are solid and are available under the trade designation BT 2000 Series and most preferably, BT 2170 and BT 2120A from Mitsubishi Gas Chemical Company, Inc. The preferred bismaleimide triazine polymeric materials are obtained from mixtures containing at least about 50% by weight of the bisphenol-A-dicyanate. The relative amounts of triazine moieties to bismaleimide moieties are such that the triazine bismaleimide polymeric component is soluble in the organic solvent employed and when combined with the epoxy polymeric material, the cured composition exhibits high resistance to elevated temperatures. Preferably, the relative amount of triazine moieties to bismaleimide moieties is about 5.5:1 to about 9:1.

The other essential polymeric material present in the compositions of the present invention is a brominated epoxy polymeric material. The brominated epoxy polymeric material must have at least 45% by weight and preferably, at least about 50% by weight of bromine and must be a tetrabrominated digylcidyl ether of a phenol. The phenols are polynuclear dihydric phenols and are represented by the formula:

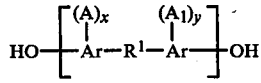

wherein Ar is an aromatic divalent hydrocarbon such as naphthylene and preferably, phenylene. A and $A_1$ which can be the same or different, are alkyl radicals, preferably having from 1 to 4 carbon atoms, halogen atoms, i.e., fluorine, chlorine, bromine, and iodine, or alkoxy radicals, preferably having from 1 to 4 carbon atoms, x and y are integers having a value 0 to a maximum value corresponding to the number of hydrogen atoms on the aromatic radical (Ar) which can be replaced by substituents and $R^1$ is a bond between adjacent carbon atoms as in dihydroxydiphenyl or is a divalent radical including, for example:

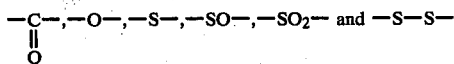

and divalent hydrocarbon radicals such as alkylene, alkylidene, cycloaliphatic, e.g., cycloalkylene and cycloalkylidene, halogenated, alkoxy or aryloxy substituted alkylene, alkylidene and cycloaliphatic radicals, as well as alkarylene and aromatic radicals including halogenated alkyl, alkoxy, or aryloxy substituted aromatic radicals and a ring fused to an Ar group; or $R^1$ can be polyalkoxy, or polysiloxy, or two or more alkylidene radicals separated by an aromatic ring, a tertiary amino group, an ether linkage, a carbonyl group, or a sulfur containing group such as sulfoxide.

Examples of specific dihydric polynuclear phenols are the bis-(hydroxyphenyl)alkanes such as 2,2-bis-(4-hydroxyphenol)propane, 2,4'-dihydroxydiphenylmethane, bis-(2-hydroxyphenyl)methane, bis-(4-hydroxyphenyl)methane, bis-(4-hydroxy-2,6-dimethyl-3-methoxyphenyl)methane, 1,1-bis-(4-hydroxyphenyl)ethane, 1,2-bis-(4-hydroxyphenyl)ethane, 1,1-bis-(4-hydroxy-2-chlorphenyl)ethane, 1,1-bis-(3-methyl-4-hydroxyphenyl)ethane, 1,3-bis-(3-methyl-4-hydroxyphenyl)propane, 2,2-bis-(2-isopropyl-4-hydroxyphenyl)propane, 2,2-bis-(4-hydroxynaphthyl)propane, 2,2-bis-(4-hydroxyphenyl)pentane, 3,3-bis-(4-hydroxyphenyl)pentane, 2,2-bis-(4-hydroxyphenyl)heptane, bis-(4-hydroxyphenyl)phenylmethane, bis-(4-hydroxyphenyl)cyclohexylmethane, 1,2-bis-(4-hydroxyphenyl)-1,2-bis-(phenyl)propane and 2,2-bis-(4-hydroxyphenyl)-1-phenyl-propane; di(hydroxyphenyl)sulfones such as bis-(4-hydroxyphenyl)sulfone, 2,4'-dihydroxydiphenyl sulfone, 5'-chloro-2,4'-dihydroxydiphenyl sulfone, and 5'-chloro-4,4'-dihydroxydiphenyl sulfone; di(hydroxyphenyl)ethers such as bis-(4-hydroxyphenyl)ether, the 4,3'-,4,2'-,2,2'-,2,3'-, dihydroxydiphenyl ethers, 4,4'-dihydroxy-2,6-dimethyldiphenyl ether, bis-(4-hydroxy-3-isobutylphenyl)ether, bis-(4-hydroxy-3-isopropylphenyl)ether, bis-(4-hydroxy-3-chlorophenyl)ether, bis-(4-hydroxy-3-fluorophenyl)ether, bis-(4-hydroxy-3-bromophenyl)ether, bis-(4-hydroxynaphthyl)ether, bis-(4-hydroxy-3-chloronaphthyl)ether, bis-(2-hydroxydiphenyl)ether, 4,4'-dihydroxy-2,5-diethoxydiphenyl ether.

The preferred dihydric polynuclear phenols are represented by the formula:

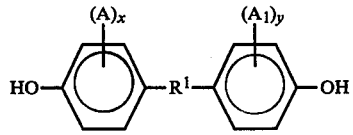

wherein A and $A_1$ are as previously defined, x and y have values from 0 to 4 inclusive and $R^1$ is a divalent saturated aliphatic hydrocarbon radical, particularly alkylene and alkylidene radicals having from 1 to 3 carbon atoms, and cycloalkylene radicals having up to and including 10 carbon atoms. The most preferred dihydric phenol is bisphenol A, i.e., 2,2-bis-(p-hydroxyphenyl)propane.

The preferred brominated epoxy polymeric materials employed according to the present invention have a bromine content of at least about 45% by weight and are commercially available such as under the trade designation Araldite LT 8049 from Ciba-Geigy Corporation. This brominated epoxy polymeric material has a melting point of about 55° C., an epoxy value (eq/100 g) of 0.26 and weight per epoxide of about 385.

In addition, in order to achieve all of the necessary properties obtained by the compositions of the present invention, the relative amounts of the bismaleimide triazine polymeric component and brominated epoxy polymeric component must be about 70 to about 80% by weight of the bismaleimide triazine polymeric component and correspondingly, about 20 to about 30% by weight of the brominated epoxy polymeric component. The above relative amounts are based upon the total of the bismaleimide triazine polymeric component and brominated epoxy polymeric component present in the composition. Use of greater amounts of the brominated epoxy polymeric component than employed according to the present invention tends to result in significantly lower glass transition temperatures of the cured products. This is detrimental to the intended use as an impregnant for preparing printed circuit boards. Moreover, as will be demonstrated hereinbelow, use of epoxy polymeric materials with less than 45% by weight of bromine does not provide the combination of properties crucial to the present invention. In addition, the preferred compositions of the present invention are substantially free from other polymeric materials such as non-brominated epoxy polymeric materials since such adversely lower the glass transition temperature of the cured compositions, which preferably should be at least about 175° C.

Furthermore, it has been noted that the stability problem of the bismaleimide triazine polymeric component is particularly pronounced when over about 65% by weight of the solids of the composition is the bismaleimide triazine polymeric component. At low percentages of the bismaleimide triazine polymeric component, the solubility properties are not noticeable to any significant extent.

The compositions of the present invention also contain an organic solvent. The solvent is preferably a low boiling point solvent and most preferably, is ketone such as acetone or methylethyl ketone. In the preferred aspects of the present invention, the solvent is substantially free, if not entirely free, from solvents other than ketones. The solvent is present in amounts of about 10 to about 70% by weight based upon the total weight of the bismaleimide triazine polymeric material, the brominated epoxy polymeric component, and the solvent present in the composition. During storage prior to use the composition generally contains about 10 to about 60% by weight of solvent. When the composition is to be employed, the amount of solvent is generally about 20 to about 70% by weight. Most preferably, during storage, the relative amount of solvent is about 30% by weight and then the composition is diluted to about 45% by weight of solvent shortly before use.

In addition, just prior to use, a catalyst is generally added to the compositions of the present invention to facilitate curing of the compositions. The catalysts employed are of the type that initiate oxidation types of reactions. Examples of suitable catalysts include metal salts of carboxylic acids such as salts of octylic acid and naphthenic acid, including zinc octoate, stannic octoate, zinc naphthenic and cobalt naphthenate; metallic salts of acetylacetone such as ferriacetylacetone and copper acetylacetone; butyltitanate; propylaluminum; metallic powders such as zinc powder and iron powder; peroxides such as dicumyl peroxide, benzoyl peroxide, cyclohexanone peroxide, t-butyl hydroperoxide, decanoyl peroxide, and di-isopropylperoxydicarbonate; amines such as triethylene diamine, N,N-dimethylbenzylamine, N-methylmorpholine, tri-N-butylamine, and N,N,N$_1$,N$_1$-tetramethylbutanediamine; imidazoles such as 2-methylimidazole, 2-undecylimidazole, 2-phenylimidazole, and 2-ethyl-4-methylimidazole; and chlorides such as stannic chloride, aluminum chloride, ferric chloride, and ferrous chloride. In addition, when desired, mixtures of curing agents can be employed. The catalyst is employed generally in amounts of about 0.01 to about 5 parts per hundred parts of resin in the composition. The preferred catalyst employed according to the present invention is zinc octoate.

The compositions of the present invention are preferably employed to prepare printed circuit boards. In preparing the boards, a fibrous substrate is coated and impregnated with the composition of the present invention. Conventional coating equipment can be employed. Subsequent to coating, the impregnated substrate is cured at a temperature of about 100° to about 200° C. for about 1 hour to about 10 minutes to form a rigid substrate. The compositions can be used to coat and/or impregnate fibrous substrates such as fiberglass, polyimides, graphite, and the like.

After the rigid substrate is formed, a sheet of copper or other conductive material can then be laminated to the rigid substrate using laminating conditions such as pressures of about 50 to about 400 pounds per square inch and temperatures of about 50° to 300° C. applied for about 30 to about 300 minutes. Then a circuit can be etched into the conductive layer using techniques well-known to form circuit boards.

The following non-limiting examples are presented to further illustrate the present invention.

EXAMPLE 1

About 345.6 parts by weight of a bismaleimide triazine composition available under the trade designation BT 2120A and containing about 280 parts by weight of solid polymeric material and about 65.6 parts by weight of methylethyl ketone; about 120 parts by weight of brominated epoxy polymeric material available under the trade designation Araldite LT 8049 having a bromine content of about 50%; about 98.4 parts by weight of additional methylethyl ketone and about 164 parts by weight of acetone are admixed. The above composition is stable at room temperature for at least 9 months. In addition, the above composition is mixed with about 0.2% by weight of a solution of 8% zinc octoate in mineral spirits. The composition is then used to imprignate glass fibers and is cured at about 175° C. using about 200 psi. The results provide good flammability, and an excellent glass transition temperature of about 200° C.

COMPARISON EXAMPLE 2

About 220 parts by weight of bismaleimide triazine composition available under the trade designation BT 2120A containing about 176 parts by weight bismaleimide triazine polymeric component and about 44 parts by weight of methylethyl ketone; about 76 parts by weight of brominated epoxide containing about 37 to 38% by weight of bromine and available under the trade designation Araldite LT 8052; about 49 parts by weight of additional methylethyl ketone; and about 82 parts by weight of acetone are admixed. Although the composition upon curing had sufficient glass transition temperature because of the lower amount of bromine present, such was flammable. Also, it was not very stable. Precipitation occurred within about 1 month. This example illustrates the criticality of the present invention of employing the specific types of brominated epoxy polymeric materials as required by the present invention even when the relative amounts of epoxy and bismaleimide triazine polymeric components are the same.

COMPARISON EXAMPLE 3

Comparison Example 2 is repeated, except that the relative amount of the bismaleimide triazine polymeric material and brominated epoxide polymeric material is adjusted to provide a bromine content based on the total solids of about 15% as in Example 1. The composition contains about 199 parts by weight of BT 2120A, about 93 parts by weight of Araldite Lt 8052, about 52 parts of additional methylethyl ketone, and about 82 parts by weight of acetone. The composition of this example when cured does not provide sufficient glass transition temperature. The glass transition temperature is about 160° C.

COMPARISON EXAMPLE 4

About 220 parts by weight of a bismaleimide triazine composition containing about 176 parts by weight of bismaleimide triazine polymeric material and about 44 parts by weight methylethyl ketone available under the trade designation BT 2102A; about 76 parts by weight of brominated epoxy containing about 20% by weight of bromine and available under the trade designation Araldite LT 8047 from Ciba-Geigy; about 49 parts by weight of additional methylethyl ketone; and about 82 parts by weight of acetone are admixed. The composition contains the same relative amounts of bismaleimide triazine polymeric material and brominated epoxy as in Example 1. However, the percent of bromine based on the solids is about 6% and the cured composition is not flameproof as is that of Example 1.

COMPARISON EXAMPLE 5

Comparison Example 4 is repeated, except that the relative amount of the bismaleimide triazine polymeric material and brominated epoxide is adjusted to provide a bromine content based upon the solids of about 15% as in Example 1. The composition contains about 81 parts by weight of BT 2120A; about 187 parts by weight of Araldite LT 8047; about 71 parts by weight of additional methylethyl ketone; and about 82 parts by weight of acetone. The composition contains about 26% by weight of bismaleimide triazine polymeric material. The glass transition temperature of the cured composition is only about 140° C.

Accordingly, as demonstrated by the above examples, it is necessary to employ the relative amounts of materials and type of brominated epoxide in order to achieve the combination of properties obtained by the compositions of the present invention. In particular, the present invention provides for the combination of flameproof characteristics, storage stability, and upon curing, a high glass transition temperature. When practicing outside of the range of the composition of the present invention, it is not possible to obtain a combination of all of these properties.

What is claimed is:

1. A composition consisting essentially of:
   (a) about 70 to about 80% by weight of bismaleimide triazine polymeric component wherein said bismaleimide triazine polymeric component is from bisphenol-A-dicyanate and the bis-imide of 4,4'-diaminodiphenyl methane and maleic anhydride;
   (b) about 20 to about 30% by weight of a brominated epoxy polymeric component wherein said brominated epoxy polymeric component is a tetrabrominated diglycidyl ether of bisphenol A and contains at least 45% by weight of bromine; and
   (c) solvent in an amount of about 10 to 70% by weight based upon the total weight of (a), (b), and (c) in the composition.

2. The composition of claim 1 wherein said brominated epoxy polymeric component contains at least about 50% by weight bromine.

3. The composition of claim 1 wherein said solvent is a ketone.

4. The composition of claim 3 wherein said solvent is substantially free from solvents other than said ketone.

5. The composition of claim 1 wherein said solvent is a ketone selected from the group of acetone, methylethyl ketone, or mixtures thereof.

6. The composition of claim 5 wherein said solvent is substantially free from solvents other than said ketone.

7. The composition of claim 1 which is substantially free from polymeric materials other than said bismaleimide triazine polymeric component and said brominated epoxy polymeric component.

8. The composition of claim 1 wherein the relative amount of triazine to bismaleimide in said triazine bismaleimide polymeric component is about 5.5:1 to about 9:1.

9. The composition of claim 1 which has a glass transition temperature of at least about 175° C. when cured.

10. The composition of claim 1 wherein said brominated epoxy polymeric material has a melting point of about 55° C., an epoxy value (eq/100 g) of 0.26, and weight per epoxide of about 385.

11. A product comprising a fibrous substrate impregnated with the composition of claim 1 and a curing agent of said composition.

12. The product of claim 11 wherein said substrate is fiberglass.

13. The product of claim 11 wherein said curing agent is zinc octoate.

14. The product of claim 11 wherein said composition when cured has a glass transition temperature of at least about 175° C.

* * * * *